(12) United States Patent
Hsieh et al.

(10) Patent No.: US 9,437,281 B2
(45) Date of Patent: *Sep. 6, 2016

(54) NEGATIVE BITLINE BOOST SCHEME FOR SRAM WRITE-ASSIST

(71) Applicant: TAIWAN SEMICONDUCTOR MANUFACTURING CO., LTD., Hsin-Chu (TW)

(72) Inventors: Wei-Jer Hsieh, Hsinchu (TW); Yangsyu Lin, New Taipei (TW); Hsiao Wen Lu, Guishan Township (TW); Chiting Cheng, Taichung (TW); Jonathan Tsung-Yung Chang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/727,931

(22) Filed: Jun. 2, 2015

(65) Prior Publication Data

US 2015/0262655 A1   Sep. 17, 2015

Related U.S. Application Data

(63) Continuation of application No. 14/077,263, filed on Nov. 12, 2013, now Pat. No. 9,070,432.

(51) Int. Cl.
*G11C 5/14* (2006.01)
*G11C 11/419* (2006.01)
*G11C 7/12* (2006.01)

(52) U.S. Cl.
CPC ............ *G11C 11/419* (2013.01); *G11C 7/12* (2013.01)

(58) Field of Classification Search
CPC .................... G11C 5/14; G11C 11/412
USPC .................................. 365/154, 226
See application file for complete search history.

(56) References Cited

U.S. PATENT DOCUMENTS

| | | | |
|---|---|---|---|
| 4,010,453 A | 3/1977 | Lewis | |
| 4,387,448 A | 6/1983 | Takemae et al. | |
| 4,404,661 A | 9/1983 | Nagayama et al. | |
| 4,513,399 A | 4/1985 | Tobita | |
| 4,858,193 A * | 8/1989 | Furutani | G11C 11/4091 327/52 |
| 6,031,754 A | 2/2000 | Derbenwick et al. | |
| 6,337,824 B1 | 1/2002 | Kono et al. | |
| 6,654,295 B2 | 11/2003 | Leung et al. | |
| 8,233,342 B2 | 7/2012 | Adams et al. | |
| 8,363,453 B2 | 1/2013 | Arsovski et al. | |
| 8,441,874 B2 | 5/2013 | Sinha et al. | |
| 8,467,251 B2 | 6/2013 | La Rosa | |
| 2007/0081379 A1 | 4/2007 | Clinton et al. | |

* cited by examiner

*Primary Examiner* — Michael Tran
(74) *Attorney, Agent, or Firm* — Duane Morris LLP

(57) ABSTRACT

A device includes a transistor switch coupled between a bit line voltage node and a ground node and a boost signal circuit coupled to a gate node of the transistor switch, where the boost signal circuit providing a boost signal responsive to a write enable signal. The device also includes a first delay element and a first capacitor in series with the first delay element. The first capacitor has a first end coupled to the bit line voltage node and a second end coupled to the gate node through the first delay element.

20 Claims, 7 Drawing Sheets

NEGATIVE BITLINE BOOST SCHEME FOR SRAM WRITE-ASSIST

CROSS-REFERENCE TO RELATED APPLICATION

This application is a continuation of and claims priority to U.S. patent application Ser. No. 14/077,263, filed Nov. 12, 2013, which issued as U.S. Pat. No. 9,070,432, the entirety of which is hereby incorporated by reference herein.

BACKGROUND

Static random access memories (SRAM) are commonly used in integrated circuits. Embedded SRAM is particularly popular in high speed communication, image processing and system-on-chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single port SRAM cell. Another type of SRAM cell is referred to as a dual port SRAM cell, which includes four pass-gate transistors. With two ports, the bit stored in the SRAM cell can be read from port-A and port-B simultaneously. This allows for parallel operations by different applications. Moreover, if a first SRAM cell and a second SRAM cell are in a same column or a same row, a read operation from the first SRAM cell can also be performed simultaneously with a write operation to the second SRAM cell.

The lowest VDD voltage (positive power supply voltage) at which an SRAM bit cell may function is referred to as Vccmin. Having a low cell VDD near Vccmin reduces leakage current and also reduces the incidence of read flips. But having a high cell VDD improves the probability of successful write operations. Therefore, the Vccmin is limited by the write operation.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

A "boost signal" may be provided to the bit line during write operations. This boost signal lowers the bit line below ground voltage, which assists in write operations. However, properly timing the boost signal has proved problematic. Further, over-boosting has been required at the near-end side of the bit line to get an effective voltage level at the far-end side of the bit line.

Figure 1:
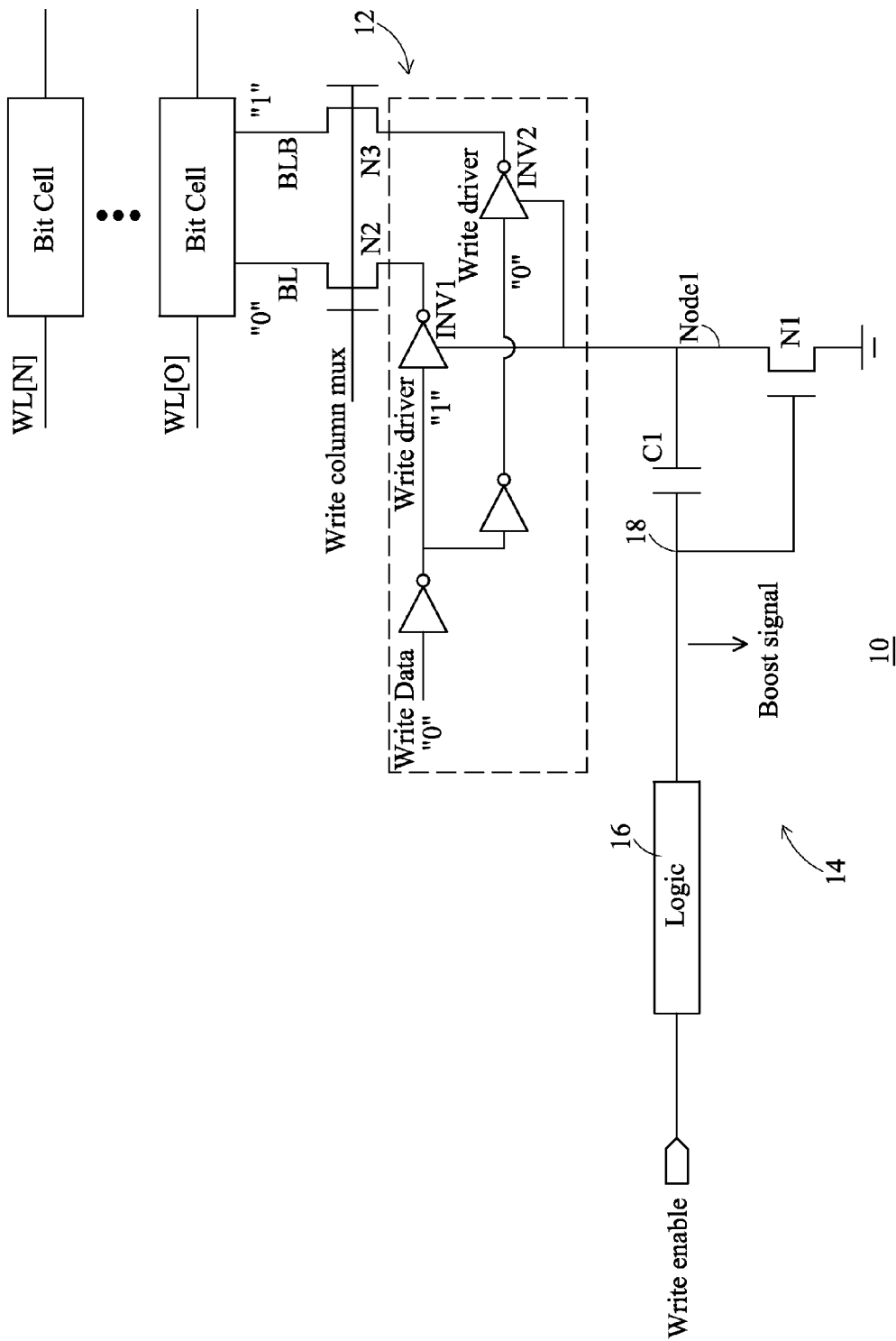
FIG. 1 illustrates a device having a boost circuit coupled to a bit line write driver.

FIG. 1 illustrates a device 10 having a boost circuit 14 coupled to a bit line write driver 12. The bit line write driver circuit 12 is of conventional design and includes a first inverter (INV1) coupled to a bit line through a write column multiplexer selection transistor (N2) and a second inverter (INV2) coupled to the inverse bit line (BLB) through a write column multiplexer transistor (N3). A column of memory cells, such as SRAM cells, is connected to the bit lines. It should be understood that while not shown this column of SRAM cells is part of a SRAM array including a matrix of SRAM cells arranged in rows and columns. Each SRAM cell is configured as a pair of cross-coupled inverters that operate to reinforce the data state stored therein, i.e., the true data node reinforces the complementary data node and vice versa. In the illustrated embodiment, each SRAM cell is a single port cell though the negative bit line boost architecture and scheme are equally applicable to dual port SRAM memories.

The illustrated figure shows a logical "0" being written into the data node of a SRAM cell through driver INV1. As such, a logical "0" is written into the complementary data node through driver INV2.

As can be seen from FIG. 1, the bit line driver circuit 12 is coupled to the boost circuit 14 at Node 1. The boost circuit includes a NMOS switch transistor N1 coupled between ground and Node 1 and a capacitor C1 directly coupled between the drain (Node 1) and gate terminals (node 18) of transistor N1. A bit line boost enable control signal ("boost signal") is provided at node 18 from logic 16, which is responsive to a write enable signal. Logic 16 may be a delay element in series with an inverter that provides a fixed, non-configurable delay to the write enable pulse at its input. The write enable signal is delayed and inverted to provide the boost signal at node 18. Before the write enable signal goes high (at the start of the write operation/period), the boost signal is high, which turns transistor N1 on and charges capacitor C1. When the boost signal is high, Node 1 is also connected to ground through switch transistor N1. After the delay, the boost signal goes low, which turns off transistor N1 and, at the same time, causes a discharge from capacitor C1, which drives boost Node 1 from ground (low) to a negative value. This negative voltage is provided to bit lines (BL/BLB), which provides a boost for the write operation performed to the SRAM cell coupled to the bit lines (BL/BLB).

It can be seen from this FIG. 1 that transistor N1 is turned off at the same time that capacitor C1 begins to discharge (i.e., since the boost signal is provided simultaneously to the gate of transistor N1 and to capacitor C1). This boost circuit provides no means by which to adjust the boost signal timing and risks boosting too early (e.g., before transistor N1 is fully off) or too late (e.g., if the fixed delay element of logic 16 is too long or too short). The circuit also requires over-boosting at the near-end side of the bit line in order to provide an effective negative voltage level at the far-end of the bit line.

Figure 2:
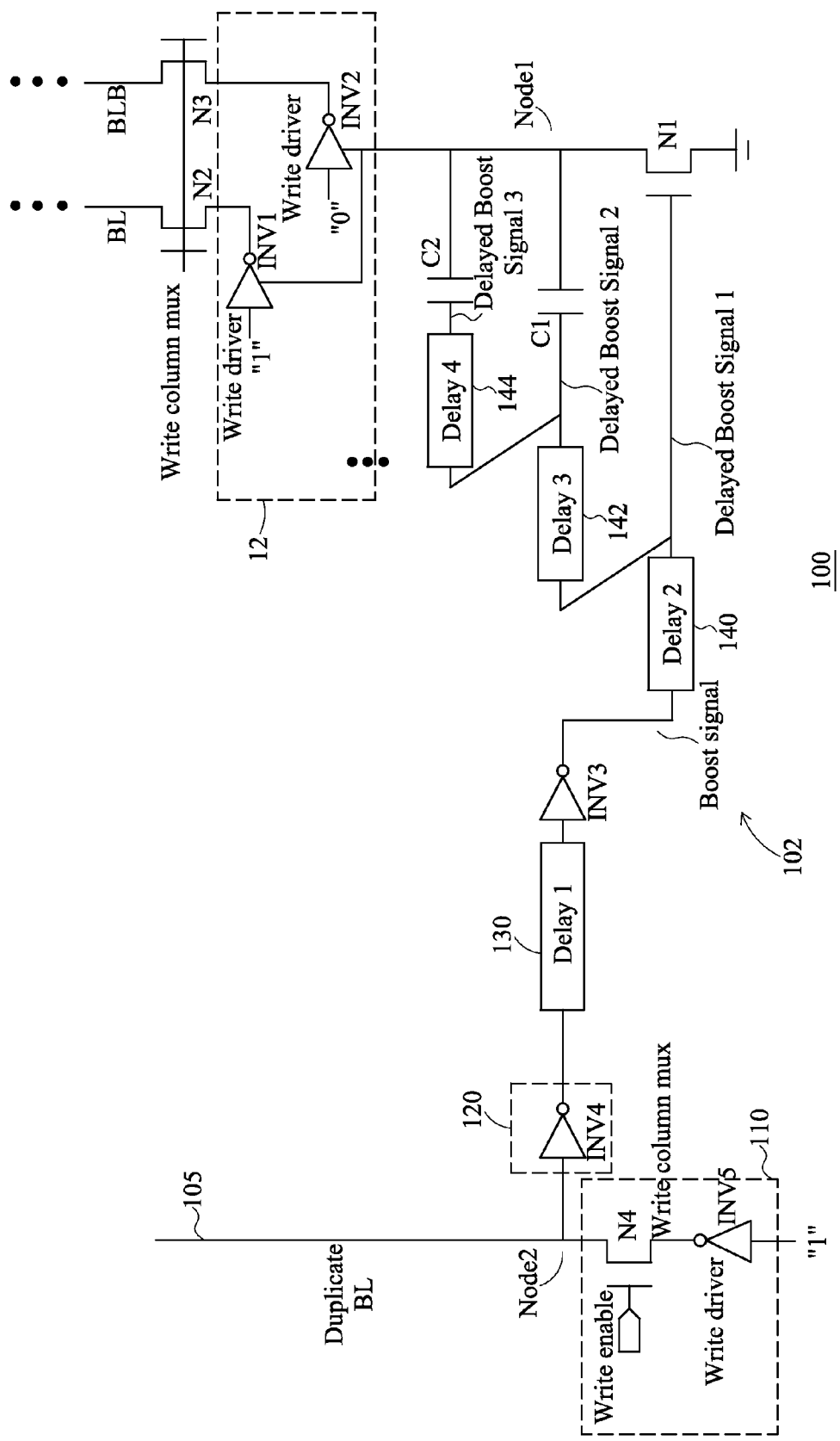
FIG. 2 illustrates a device having an embodiment of an improved boost circuit coupled to a bit line write driver.

FIG. 2 illustrates a memory device 100 having an embodiment of a boost circuit 102 coupled to a bit line write driver 12, which is identical to the bit line write driver 12 of FIG. 1. The bit line write driver 12 is connected to a SRAM array (not shown) as described above in connection with FIG. 1.

The boost circuit 102 includes a duplicate (or dummy) bit line 105 coupled to a dummy write driver tracking circuit 110 (also referred to as a dummy write driver) at a node labeled Node 2. The write driver tracking circuit 110 mirrors the writer driver 12 and includes a dummy writer driver (INV5) coupled to a dummy NMOS column multiplexer selection transistor N4, which is controlled by the write enable signal. The boost circuit 102 also includes a detector 120, which in the illustrated embodiment is an inverter (INV4). A delay element 130 is coupled to the output of the detector 120 and the delayed signal (from the delay element 130) is inverted by inverter INV3 to provide the boost enable control signal ("boost signal"). The boost circuit 102 also includes a second delay element 140 coupled between the output of INV3 and the gate of transistor N1, which provides "delayed boost signal 1". A third delay element 142 is coupled between the output of the second delay element 140 (i.e., the gate node of transistor N1) and the capacitor C1. The third delay element 142 provides "delayed boost signal 2". The boost circuit 102 also includes a second capacitor C2 coupled between Node 1 and a fourth delay element 144, which is coupled to the output of the third delay element 142. The fourth delay element provides "delayed boost signal 3". As described below, in operation the boost circuit 102 provides a sequential boost circuit with multiple delays between boosts. This provide better negative voltage delivery efficiency to SRAM cells at the far-end of the bit line. Using a sequential boost also induces less peak voltage at the near-end of the bit line.

The operation of the boost circuit of FIG. 2 is explained below. The duplicate bit line is high when there is no write operation (i.e., when Write Enable is low), which keeps transistor N1 on and connects Node 1 to ground. Capacitors C1 and C2 are charged during this period. During a write operation, the write enable signal goes high. This turns on transistors N2 and N3 to connect the bit lines (BL/BLB) to Node 1. It also turns on transistor N4 to connect Node 2 to the output of INV5, which is logic low. Node 2 transitions from high to low, which is detected by detector 120. Inverter INV4 outputs logic high when the transition point is detected. The output signal from INV4 is delayed by first delay element 130 and then inverted again to provide the boost signal, which is basically a delayed version of the signal at Node 2. The boost signal is delayed by second delay element 140 to provide delayed boost signal 1. Delayed boost signal 1 turns off discharge transistor N1 after a combined delay (Delay 1+Delay 2) after the transition from high to low was detected by detector 120. It should be understood that one of the first and second delay elements 130, 140 is optional, and that the desired delay (Delay 1+Delay 2) can be provided by a properly configured first delay element 130 or second delay element 140. Logically, delay elements 130, 140 can be considered one delay element. At this time, transistor N1 is off, which disconnects Node 1 from the ground node, and delayed boost signal 2 is still high. After a further delay (Delay 3) caused by the third delay element 142, delayed boost signal 2 also transitions from high to low. This causes a discharge from capacitor C1, which drives boost Node 1 from ground (low) to a first negative value. This negative voltage is delivered to the bit cell through the writer driver 12. Delay 3 provided by the third delay element 142 is used to ensure that transistor N1 is completely off. If N1 is not completely off and capacitor C1 is boosted, it will lose some charge. In embodiments, Delay 3 is made only as short as necessary to ensure transistor N1 is off.

After a further delay (Delay 4) caused by the fourth delay element 144, delayed boost signal 3 transitions from high to low. This causes a discharge from capacitor C2, which drives boost Node 1 from the first negative value to a lower second negative value. This second negative voltage is delivered to the bit cell through the write driver 12.

Figure 2A:
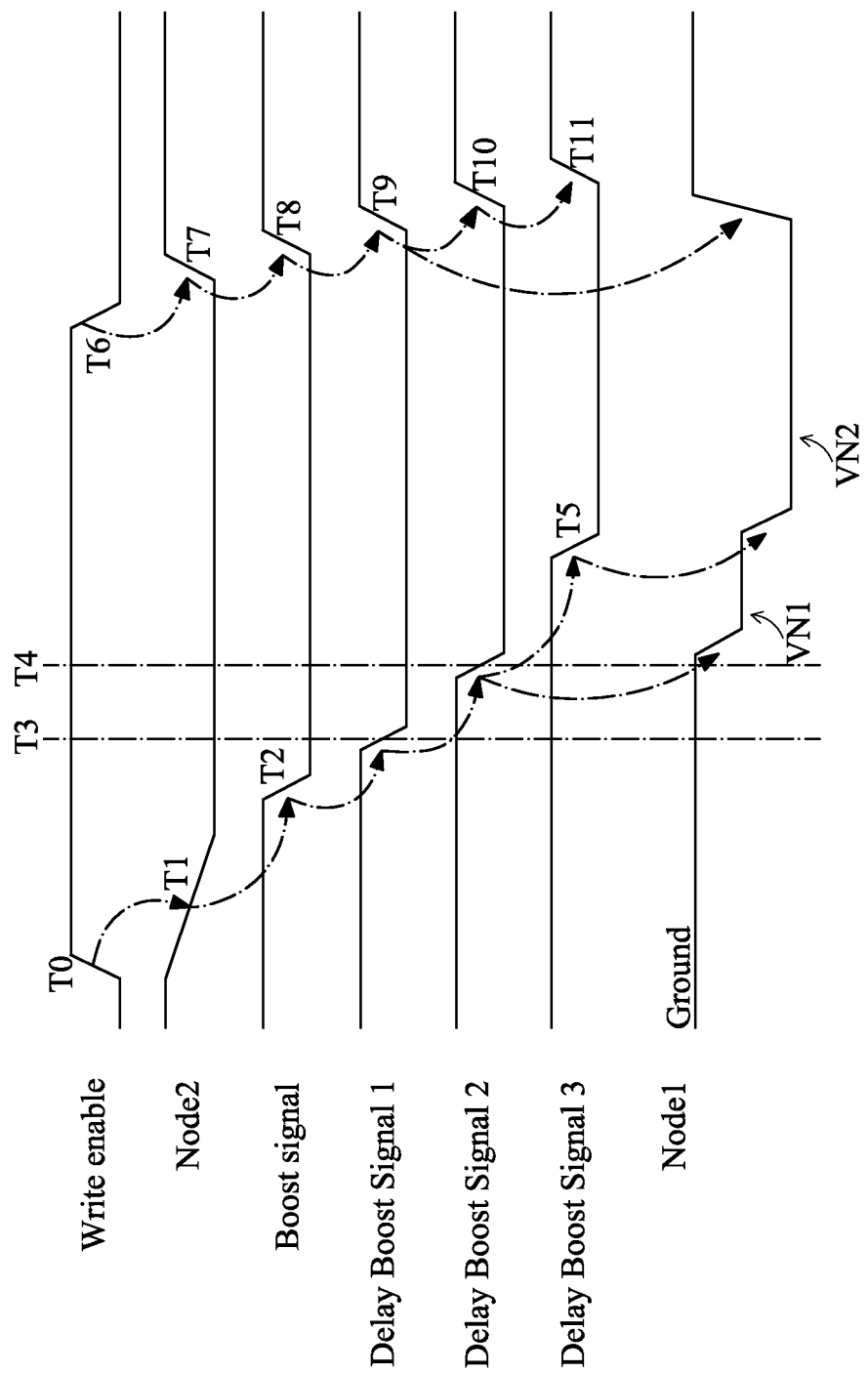
FIG. 2A is a timing diagram illustrating the operation of the device of FIG. 2.

FIG. 2A is a timing diagram that further illustrates the operation of the device 100 of FIG. 2. At time T0 the Write Enable signal goes high, which turns on transistor N4 and drives Node 2 low at time T1. After the delay (Delay 1 due to delay element 130) the Boost Signal transitions from high to low (at time T2). After a further delay (Delay 2 due to delay element 140), the first delayed boost signal (Delay Boost Signal 1) transitions from high to low (at time T3). This turns off transistor N1, which up to time T3 is on and holds Node 1 at ground. After a further delay (Delay 3) from time T3 to T4, the second delayed boost signal (Delay Boost Signal 2) transitions low. This boosts capacitor C1 and drives Node 1 to a first negative voltage (VN1). After another delay (Delay 4) from time T4 to T5, the third delayed boost signal (Delay Boost Signal 3) transitions low. This boosts capacitor C2 and drives Node 1 to a second negative voltage (VN2). At time T6, the Write Enable signal goes low. This transition causes Node 2 to transition high at time T7. In response thereto, the Boost Signal transitions high at time T8. This transition cascades through to the Delay Boost Signal 1, Delay Boost Signal 2 and Delay Boost Signal 3 at times T9, T10 and T11, respectively. As shown in the timing diagram, with the Delay Boost Signal 1 going high at time T9, transistor N1 is again turned on, which drives Node 1 to ground from second negative voltage VN2.

Figure 3:
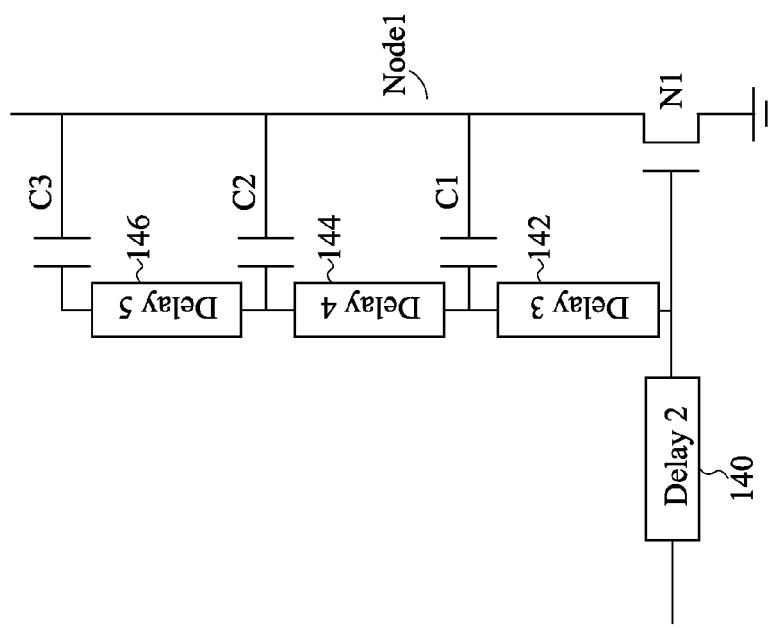
FIG. 3 illustrates an alternative embodiment of a boost circuit.

While the embodiment of FIG. 2 illustrates the use of two capacitors and two delayed, sequential boosts, it should be understood that that number is merely for illustrative purposes. For example, as shown in FIG. 3, a fifth delay element 146 and a third capacitor C3 are added so that the circuit could operate with three delayed, sequential boosts. Of course, based on the teachings herein a circuit with more sequential boosts (e.g., 4 or more) could be designed. Likewise, in an embodiment, only one delayed boost may be used after turning off transistor N1, i.e., in a design using only the second and third delay elements 140, 142 and one capacitor C1. Such an embodiment would, unlike the device of FIG. 1, ensure that transistor N1 is off before the negative boost is provided.

Figure 4:
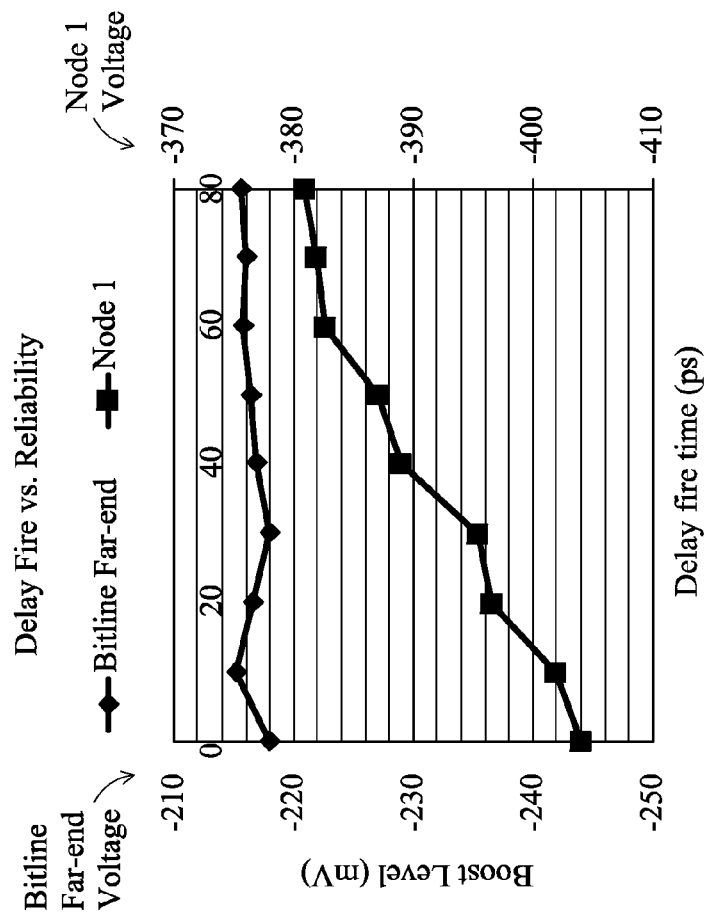
FIG. 4 illustrates the results of a simulation of the boost circuit of FIG. 3.

FIG. 4 illustrates the results of a simulation of the boost circuit of FIG. 3. The X-axis represents delay fire time in picoseconds (ps) for the boost signal. The Node 1 and bit line far-end voltages are tracked from time 0 to 80 ps. As can be seen in from the figure, the bit line far-end voltage stays at a relatively constant negative voltage between about negative 216-218 mv. The Node 1 voltage only moves about 22 mv from an initial peak value of negative 404 mv (at 0 ms) to negative 382 mv (at 80 ms). These results illustrate that there will be no overboosting at the near-end of the bit line while the negative voltage is effectively conveyed to the far-end of the bit line.

Figure 5A:
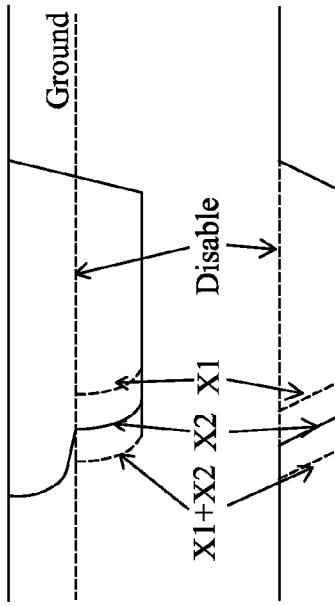
FIG. 5A is a timing diagram illustrating the operation of the variable delay boost circuit of FIG. 5.
Figure 5:
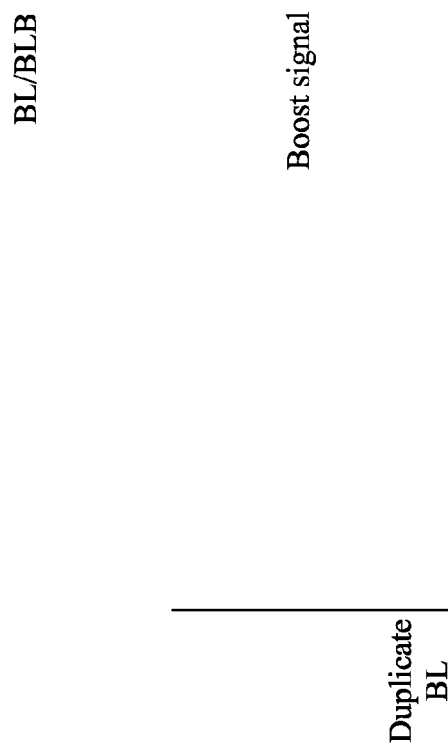
FIG. 5 illustrates an embodiment of a variable delay boost circuit.
Figure 5:
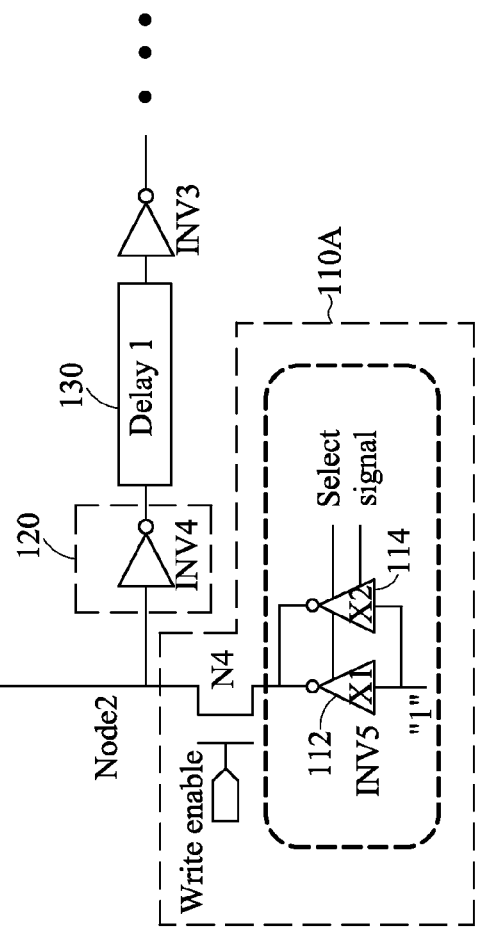

FIG. 5 illustrates an embodiment of a variable delay boost signal circuit. The circuit is identical to that of FIG. 1 only a modified write driver tracking circuit 110A is used. The write driver tracking circuit 110A includes two or more writer driver inverters. In the illustrated embodiment, the write driver tracking circuit 110A includes drivers 112 and 114. Driver (inverter 114) has a greater drive capability than driver 112. For example, the drive capability inverter 114 can be twice that of inverter 112. A select signal controls whether one or both of inverters 112, 114 are used. As shown in diagram of FIG. 5A, if both inverters are used, then Node 2 is driven low quickly, meaning there is a shorter delay before the detector 120 detects the transition at Node 2 and the boost signal is issued. If only inverter 112 is used, then Node 2 is driven low slowly, meaning there is a longer delay before the detector 120 detects the transition at Node 2 and the boost signal is issued. Finally, if only inverter 114 is used, which has a stronger drive than inverter 112 but less drive that the combined drive capability of inverters 112 and 114, then there is an intermediate delay before the detector 120 detects the transition at Node 2 and the boost signal is issued.

As can be seen in FIG. 5A, the bit line voltage at BL/BLB illustrates that the rest of the boost circuit of FIG. 5 is configured as shown in FIG. 1. This can be seen from the voltage at the bit line being driven to a negative voltage when the boost signal transitions, meaning the same boost signal is coupled to both the gate of transistor N1 and to the capacitor C1. Of course, the configuration of FIG. 5 can also be used with the sequential delay scheme and boost circuit illustrated in FIGS. 2 and 3. The same is true of the alternative embodiments described below in connection with FIGS. 6 and 7.

The "select signal" of FIG. 5 can be a one-time setting, such as through a pin, for a SRAM device. If the design calls for a faster SRAM design, then an earlier boost point is selected. If the design calls for a more efficient SRAM design, the later boost point is selected. And, of course, and intermediate boost point can be selected as an appropriate design compromise.

Figure 6A:
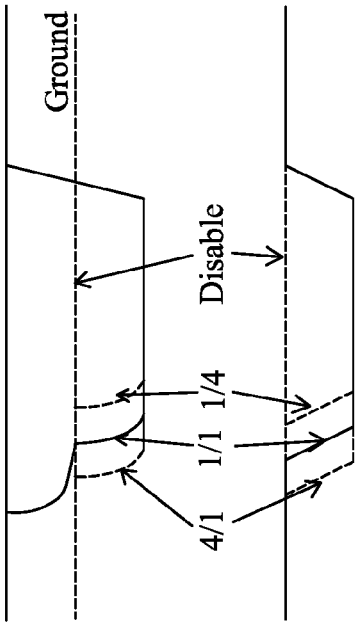
FIG. 6A is a timing diagram illustrating the operation of the variable delay boost circuit of FIG. 6.
Figure 6:
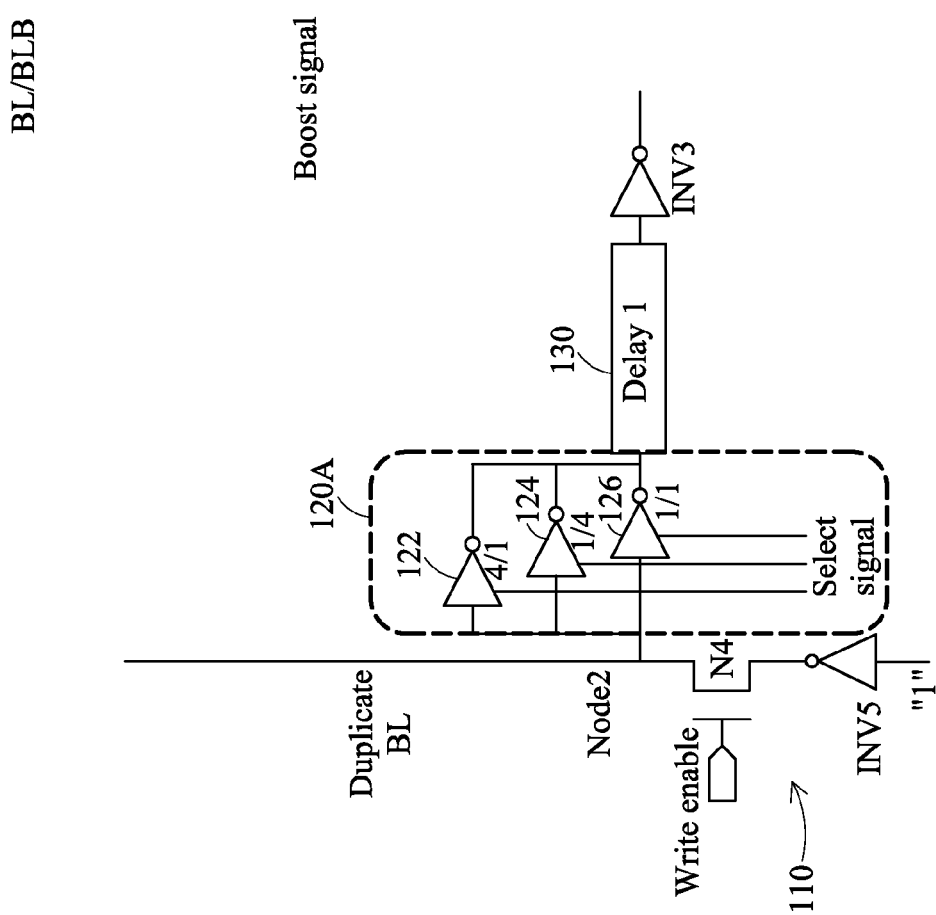
FIG. 6 illustrates an alternative embodiment of a variable delay boost circuit.

Turning to FIG. 6, another embodiment of a variable delay boost signal circuit is illustrated. This circuit uses a modified detector 120A where the detection point can be configured through the select signal. In this embodiment, the detector includes plural detectors, such as detectors 122, 124 and 126, each with a different detection point. The particular detector to be used is selected via the selection signal as described above in connection with FIG. 5. Detector 122 corresponds to an early detection point. Detector 124 corresponds to a late detection point. Finally, detector 126 corresponds to a middle detection point. In embodiments, the detectors are CMOS inverters. For example, the detector 126 can be a balanced detector, with even number and/or sized PMOS and NMOS transistors. In contrast, detector 122 and 126 can have weighted number and/or sizes of PMOS/NMOS transistors in the CMOS inverter such that they are configured to change their output at an early detection point (in the case of detector 122) or a later detection point (in the case of detector 124). Similar to FIG. 5A, FIG. 6A is a timing diagram illustrating the operation of the variable delay boost circuit of FIG. 6.

Figure 7A:
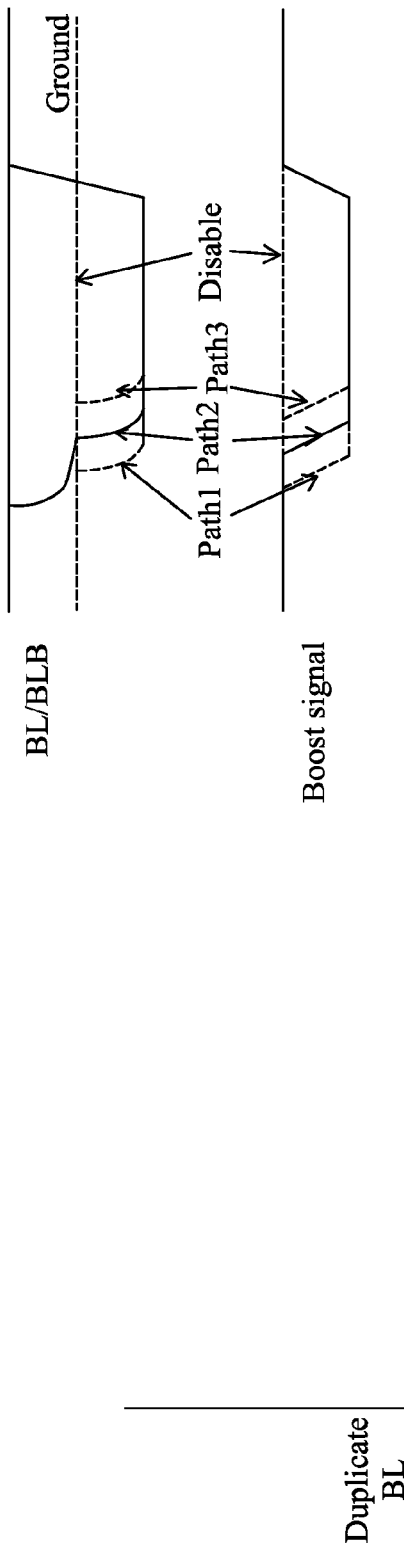
FIG. 7A is a timing diagram illustrating the operation of the variable delay boost circuit of FIG. 7.
Figure 7:
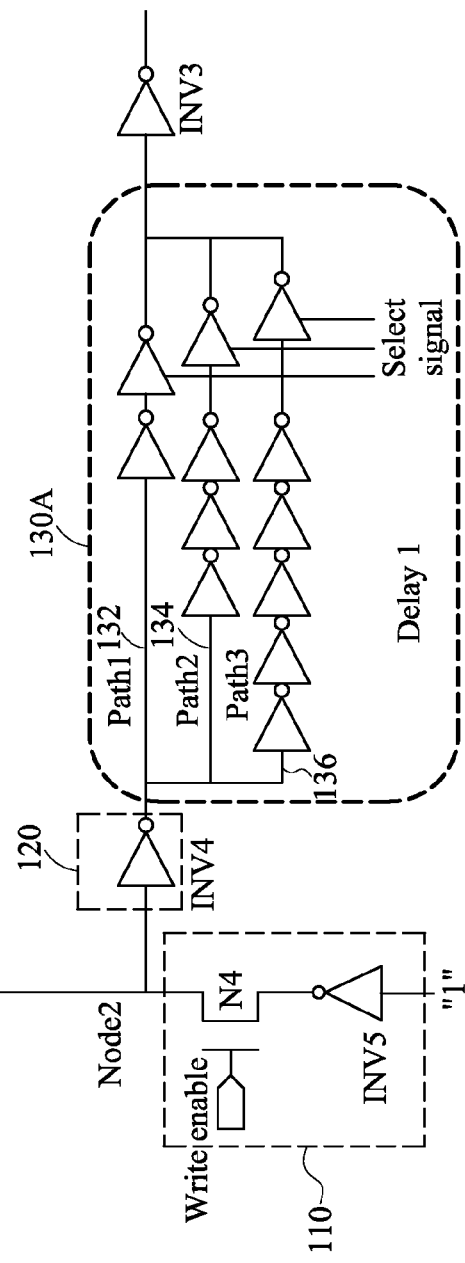
FIG. 7 illustrates an alternative embodiment of a variable delay boost circuit.

FIG. 7 illustrates another embodiment of a variable delay boost signal circuit. This circuit uses a modified delay element 130. In this embodiment, delay element 130 includes multiple delay paths that are selectable. In the illustrated embodiment, the delay element 130A includes three delay paths though it should be understood that two delay paths may be used or more than three delay paths may be used in embodiments. Path 132 includes the fewest number of delay elements, path 136 includes the greatest number of delay elements and path 134 includes delay elements that provide a delay between the delay provided by path 132 and the delay provided by path 136. Again, the path that is to be used can be selected by way of a selection signal. Similar to FIGS. 5A and 6A, FIG. 7A is a timing diagram illustrating the operation of the variable delay boost circuit of FIG. 7.

It should be understood that one or more of the approaches of FIGS. 5-7 for proving a variable delay boost circuit may be used together in a SRAM design as desired. Also, the variable delay boost circuit of FIGS. 5 to 7 may be used with the sequential boost scheme of FIGS. 2 and 3.

As described above, embodiments of the boost circuit provide a sequential boost signal, i.e., a boost signal that provides more than a one-time boost). Use of such a sequential boost signal provides an improved negative voltage signal that can be delivered efficiently to SRAM cells at the far-end of a bit line and induces less peak voltage (overboosting) at cells connected to the near-end of the bit line. It is believed that by boosting sequentially as disclosed herein, such embodiments avoid coupling all of the charge in the boost capacitor to the bitline at the same time, which avoids a larger peak at the near-end of the bit line. In some embodiments, the boost circuit is configurable, such as through a selection signal, to select a desired initial delay in providing the first boost signal from the write enable signal. These embodiments allow the designer to configure the device as need for high speed and/or efficient operation or compromise therebetween.

In certain embodiments described herein, a device includes: a transistor switch coupled between a bit line voltage node and a ground node; a boost signal circuit coupled to a gate node of the transistor switch, the boost signal circuit providing a boost signal responsive to a write enable signal; a first delay element; and a first capacitor in series with the first delay element and having a first end coupled to the bit line voltage node and a second end coupled to the gate node through the first delay element.

In embodiments the device the first delay element couples a first delayed version of the boost signal to the first capacitor for driving the bit line voltage node to a first negative voltage when the transistor switch is off.

In embodiments, the boost signal turns the transistor switch off and the first delay element provides a delay sufficient to allow the transistor switch to be fully turned off before the first delayed version of the boost signal is coupled to the first capacitor.

In embodiments, the device further includes a second delay element; and a second capacitor in series with the second delay element and having a first end coupled to the bit line voltage node and a second end coupled to second end of the first capacitor through the second delay element.

In embodiments, the first delay element couples a first delayed version of the boost signal to the first capacitor for driving the bit line voltage node to a first negative voltage, and the second delay element couples a second delay version of the boost signal to the second capacitor for driving the bit line voltage node to a second negative voltage.

In embodiments, the boost signal turns the transistor switch off and the first delay element provides a delay sufficient to allow the transistor switch to be fully turned off before the first delayed version of the boost signal is coupled to the first capacitor.

In embodiments, the device further includes a dummy bit line coupled to a dummy write driver, the dummy write driver responsive to a write enable signal to drive the dummy bit line to transition between high and low; and a detector coupled to the dummy bit line for detecting a transition of the dummy bit line between high and low, wherein the boost signal circuit is responsive to an output of the detector for providing the boost signal.

In embodiments of the device, the boost signal circuit further includes a delay element coupled between the detector and the gate node of the switching transistor.

In embodiments, the device further includes a write driver coupled to the bit line voltage node and a SRAM array coupled to the write driver, the write driver passing the voltage of the bit line voltage node to a bit line in the SRAM array.

In certain embodiments described herein, a device includes a transistor switch coupled between a bit line voltage node and a ground node; a variable delay boost signal circuit coupled to a gate node of the transistor switch, the variable delay boost signal circuit providing a boost signal responsive to a write enable signal, the variable delay boost signal circuit being responsive to a selection signal for selecting one of a plurality of selectable boost signal delays; and a first capacitor coupled between the gate node of the transistor switch and the bit line voltage node.

In embodiments, the variable delay boost signal circuit includes: a dummy bit line coupled to a dummy write driver, the dummy write driver responsive to a write enable signal to drive the dummy bit line to transition between high and low; a detector coupled to the dummy bit line for detecting a transition of the dummy bit line between high and low; and a delay element coupled between the detector and the gate node of the switching transistor.

In embodiments, the dummy write driver is responsive to the selection signal, the dummy write driver having plural selectable drive capabilities corresponding to the plurality of selectable boost signal delays.

In embodiments, the dummy write driver includes a plurality of selectable drivers.

In embodiments, at least one of the selectable drivers has a greater drive capability than another one of the selectable drivers.

In embodiments, the detector is responsive to the selection signal, the detector having plural selectable detection points corresponding to the plurality of selectable boost signal delays.

In embodiments, the detector includes a plurality of selectable detectors each having a different detection point.

In embodiments, the delay element is responsive to the selection signal, the delay element having plural selectable delays corresponding to the plurality of selectable boost signal delays.

In embodiments, the delay element includes a plurality of selectable delay paths corresponding to the plurality of selectable boost signal delays.

In certain embodiments described herein, a method of sequentially negatively boosting a bit line voltage for writing data to a memory cell is provided. The method includes the steps of: during a write enable period connecting a bit line voltage node to a ground node through a switch transistor; responsive to a boost signal turning the switch transistor off to disconnect the bit line voltage node to the ground node; after the switch transistor is turned off, initiating driving the bit line voltage node to a first negative voltage with a capacitor coupled to the bit line voltage node; and after the write enable period, turning the switch transistor on to reconnect the bit line voltage node to the ground node.

In certain embodiments of the method, the method further includes the steps of delaying after initiating driving the bit line voltage node to the first negative voltage and then after the delaying initiating driving the bit line voltage to a second negative voltage lower than the first bit line voltage with a second capacitor coupled to the bit line voltage node.

Although examples are illustrated and described herein, embodiments are nevertheless not limited to the details shown, since various modifications and structural changes may be made therein by those of ordinary skill within the scope and range of equivalents of the claims.

What is claimed is:

1. A device comprising:
   a switch coupled between a bit line voltage node and a low voltage supply node;
   a boost signal circuit coupled to a control node of the switch, the boost signal circuit providing a boost signal responsive to a write enable signal;
   a plurality of delay elements;
   a first capacitor having a first end coupled to the bit line voltage node and a second end coupled to the control node; and
   a second capacitor having a first end coupled to the bit line voltage node and a second end coupled to the second end of the first capacitor.

2. The device of claim 1, wherein a first delay element from the plurality of delay elements couples a first delayed version of the boost signal to the first capacitor for driving the bit line voltage node to a first voltage below the voltage of the low voltage supply node when the switch is open.

3. The device of claim 2, wherein the switch is a transistor and the boost signal turns the transistor off and the first delay element provides a delay sufficient to allow the transistor to be fully turned off before the first delayed version of the boost signal is coupled to the first capacitor.

4. The device of claim 1,
   wherein a first delay element from the plurality of delay elements couples a first delayed version of the boost signal to the first capacitor for driving the bit line voltage node to a first voltage below the voltage of the low voltage supply node,
   wherein a second delay element from the plurality of delay elements couples a second delayed version of the boost signal to the second capacitor for driving the bit line voltage node to a second voltage below the voltage of the first voltage.

5. The device of claim 4, wherein the switch is a transistor and the boost signal turns the transistor off and the first delay element provides a delay sufficient to allow the transistor to be fully turned off before the first delayed version of the boost signal is coupled to the first capacitor.

6. The device of claim 1, further comprising:
   a dummy bit line coupled to a dummy write driver, the dummy write driver responsive to a write enable signal to drive the dummy bit line to transition between high and low; and
   a detector coupled to the dummy bit line for detecting a transition of the dummy bit line between high and low, wherein the boost signal circuit is responsive to an output of the detector for providing the boost signal.

7. The device of claim 6, wherein the boost signal circuit further comprises a delay element coupled between the detector and the control node of the switch.

8. The device of claim 1, further comprising a write driver coupled to the bit line voltage node and a SRAM array coupled to the write driver, the write driver passing the voltage of the bit line voltage node to a bit line in the SRAM array.

9. The device of claim 1, wherein the boost signal circuit is a variable delay boost signal circuit, the variable delay boost signal circuit being responsive to a selection signal for selecting one of a plurality of selectable boost signal delays.

10. The device of claim 9, wherein the variable delay boost signal circuit comprises:
a dummy bit line coupled to a dummy write driver, the dummy write driver responsive to the write enable signal to drive the dummy bit line to transition between high and low;
a detector coupled to the dummy bit line for detecting a transition of the dummy bit line between high and low; and
a delay element coupled between the detector and the control node of the switch.

11. The device of claim 10, wherein the dummy write driver is responsive to the selection signal, the dummy write driver having plural selectable drive capabilities corresponding to the plurality of selectable boost signal delays.

12. The device of claim 11, wherein the dummy write driver comprises a plurality of selectable drivers.

13. The device of claim 12, wherein at least one of the selectable drivers has a greater drive capability than another one of the selectable drivers.

14. The device of claim 10, wherein the detector is responsive to the selection signal, the detector having plural selectable detection points corresponding to the plurality of selectable boost signal delays.

15. The device of claim 14, wherein the detector comprises a plurality of selectable detectors each having a different detection point.

16. The device of claim 10, wherein the delay element is responsive to the selection signal, the delay element having plural selectable delays corresponding to the plurality of selectable boost signal delays.

17. The device of claim 16, wherein the delay element comprises a plurality of selectable delay paths corresponding to the plurality of selectable boost signal delays.

18. A method of sequentially negatively boosting a bit line voltage for writing data to a memory cell, comprising the steps of:
during a write enable period connecting a bit line voltage node to a ground node through a switch;
responsive to a boost signal opening the switch to disconnect the bit line voltage node from the ground node;
after the switch is opened, initiating driving the bit line voltage node to a first negative voltage; and
after the write enable period, closing the switch to reconnect the bit line voltage node to the ground node.

19. The method of claim 18, further comprising delaying after initiating driving the bit line voltage node to the first negative voltage and then after the delaying initiating driving the bit line voltage to a second negative voltage lower than the first bit line voltage.

20. A SRAM memory comprising:
a SRAM array;
a write driver coupled to a bit line voltage node, the write driver passing a voltage of the bit line voltage node to a bit line in the SRAM array;
a switch coupled between the bit line voltage node and a ground node;
a boost signal circuit coupled to a control node of the switch, the boost signal circuit providing a boost signal responsive to a write enable signal;
a first capacitor having a first end coupled to the bit line voltage node and a second end coupled to the control node of the switch;
a dummy bit line coupled to a dummy write driver, the dummy write driver responsive to a write enable signal to drive the dummy bit line to transition between high and low; and
a detector coupled to the dummy bit line for detecting a transition of the dummy bit line between high and low, wherein the boost signal circuit is responsive to an output of the detector for providing the boost signal.

* * * * *